(12) United States Patent
Wang et al.

(10) Patent No.: US 8,420,305 B2
(45) Date of Patent: Apr. 16, 2013

(54) METHOD AND APPARATUS FOR GENERATING PERIODIC PATTERNS BY STEP-AND-ALIGN INTERFERENCE LITHOGRAPHY

(75) Inventors: Lon Wang, Taipei (TW); Yung-Pin Chen, Tainan (TW); Chih-Sheng Jao, Taoyuan County (TW); Shuo-Hung Chang, Taipei County (TW); Jer-Haur Chang, Changhua County (TW)

(73) Assignee: Industrial Technology Research Institute, Hsin-Chu (TW)

( * ) Notice: Subject to any disclaimer, the term of this patent is extended or adjusted under 35 U.S.C. 154(b) by 345 days.

(21) Appl. No.: 12/774,556

(22) Filed: May 5, 2010

(65) Prior Publication Data

US 2010/0216075 A1    Aug. 26, 2010

Related U.S. Application Data

(62) Division of application No. 11/979,896, filed on Nov. 9, 2007, now Pat. No. 8,233,136.

(30) Foreign Application Priority Data

Jun. 12, 2007    (TW) ............................... 96121136 A

(51) Int. Cl.
    *G03C 5/06*    (2006.01)
(52) U.S. Cl.
    USPC ............................ 430/394; 430/397; 430/322
(58) Field of Classification Search .................. 430/394, 430/397, 322
See application file for complete search history.

(56) References Cited

U.S. PATENT DOCUMENTS

| | | |
|---|---|---|
| 5,291,317 A | 3/1994 | Newswanger |
| 5,892,597 A | 4/1999 | Iwata et al. |
| 5,955,221 A | 9/1999 | Sanders et al. |
| 6,110,652 A | 8/2000 | Stork et al. |
| 6,403,291 B1 * | 6/2002 | Kawashima et al. ......... 430/394 |
| 2006/0125913 A1 | 6/2006 | Sceats et al. |

FOREIGN PATENT DOCUMENTS

| | | |
|---|---|---|
| CN | 2432001 Y | 5/2001 |
| JP | 60-156004 A | 8/1985 |

OTHER PUBLICATIONS

Large-area origination and replication of microstructures with optical functions (Jurgen Mohr, Proceedings of SPIE vol. 5464), Gombert et al., pp. 129-136.
Some applicaton cases and related manufacturing techniques for optically functional microstructures on large areas. (2004 Society of Photo-Optical Instrumentation Engineers) Gombert et al., pp. 2525-2533.

* cited by examiner

*Primary Examiner* — Daborah Chacko Davis
(74) *Attorney, Agent, or Firm* — Birch, Stewart, Kolasch & Birch, LLP

(57) ABSTRACT

The present invention provides a method and an apparatus for generating periodic patterns by step-and-align interference lithography, wherein at least two coherent light beams with a pattern are controlled to project onto a substrate to be exposed to form an interference-patterned region on the substrate. Thereafter, by means of moving the substrate or the light beams stepwisely, a patterned region with a large area can be formed on the substrate. According to the present invention, the optical path and exposure time may be shortened to reduce defect formation during lithographic processing and to improve the yield.

10 Claims, 13 Drawing Sheets

FGI. 6A

METHOD AND APPARATUS FOR GENERATING PERIODIC PATTERNS BY STEP-AND-ALIGN INTERFERENCE LITHOGRAPHY

This Application is a Divisional of application Ser. No. 11/979,896, filed on Nov. 9, 2007, now U.S. Pat. No. 8,233,136, and claims priority on Taiwanese Application No. 096121136, filed on Jun. 12, 2007. The entire contents of which are hereby incorporated by reference in their entirety.

BACKGROUND OF THE INVENTION

1. Field of the Invention

The present invention generally relates to a method and an apparatus for generating periodic patterns and, more particularly, to a method and an apparatus for generating periodic patterns by step-and-align interference lithography, using at least two coherent light beams with controlled intensity distribution to project onto a photo-resist coated substrate to form an interference-patterned region on the substrate. Thereafter, by means of moving the substrate or the light beams stepwisely, a large area composed of continuous patterned regions can be formed on the substrate.

2. Description of the Prior Art

Interference lithography uses at least two light beams to overlap on a substrate so as to form periodic patterns on the photoresist layer on the substrate. Thereby, periodic microscale structures such as lines, holes, rods and the like can be manufactured. Using interference lithography, short wavelength light sources and photo-resist, instead of conventional photo-lithography equipments and photo-masks, are required to obtain periodic patterns with small line width, and enables large depth of focus. Therefore, interference lithography has been widely used in various applications such as manufacturing of Bragg gratings for optical fiber communication, opto-electronics and semiconductor light sources such as distributed feedback (DFB) lasers, distributed Bragg reflector (DBR) lasers and photonic crystal structures. Furthermore, interference lithography can also be used along with thermal treatment on a thin film to re-grow the grains and magnetize the grids on a magnetic thin film for data storage applications.

Recently, with the increasing demand of large-area applications in displays, flexible electronic devices and solar cells, it is required that opto-electronic devices are manufactured with a large area. Most of these devices are formed of periodic sub-micro structures. For example, one-dimensional grating structures are used as polarizers for liquid crystal displays. Two-dimensional periodic structures are used as anti-reflection layers to enhance the transmission efficiency of solar cells, and light uniformity of backlight modules in display devices. Therefore, it is crucial to efficiently manufacture large-area periodic structures for consumer electronics industries, and lots of efforts have been made on research and development of large-area periodic structures.

Conventional interference lithography is used for generating small-area periodic sub-micro structures due to the limitation of the optical configuration. In the prior art, Andreas Gombert, et al. in Fraunhofer Institute use interference lithography to manufacture large-area periodic sub-micro structures, which is disclosed in "Large-area origination and replication of microstructures with optical functions," SPIE Vol. 5454, pp. 129, 2004 and "Some application cases and related manufacturing techniques for optically functional microstructures on large areas," Opt. Eng. 43 (11) 2525-2533, 2004. As shown in FIG. 1, a one-step exposure is used to manufacture periodic structures. The interference lithography system uses a laser 10 to generate a light beam 100, which is split by a beam splitter 11 and reflected by reflectors 12 to generate two coherent light beams 101 and 102. The coherent light beams 101 and 102 overlap on a substrate 14 with a photo-resist layer thereon after passing through lenses 13 to form an interference-patterned region.

However, in FIG. 1, a large space is required for implementation because it takes a distance (21 meters as disclosed by Andreas Gombert, et al.) long enough for the spherical wave from the point light source to travel and expand to an approximate planar wave. Moreover, it takes a considerably long exposure time (for hours) to expose the photo-resist because the power per unit area decreases with the distance. Accordingly, the environment has to be precisely controlled during exposure to prevent disturbance; therefore the exposure conditions such as temperature gradient, airflow, humidity and mechanical vibration need to be stabilized.

Moreover, U.S. Pat. No. 6,882,477 discloses a method and system for interference lithography utilizing phase-locked scanning beams, wherein large-size periodic patterns are formed by partially overlapping sequential boustrophedonic scans of a Gaussian beam. However, in this method, high-precision positioning control is required and the process time is long. Moreover, since the light intensity profile is a Gaussian distribution, each of the overlapped regions has to occupy 60% of a previous scanning region so as to achieve pattern uniformity.

Furthermore, U.S. Patent Pub. No. 2007/0023692 discloses an interference lithography method, in which an alignment window is formed by exposing a photo-resist layer on a transparent substrate (such as a glass substrate or a quartz substrate) to form large-area interference patterns by overlapping sequential scans through an alignment means under the transparent substrate. However, since the light intensity profile is a circular Gaussian distribution, uniform exposure dosage is hard to achieve because the areas of overlapped regions after multi-exposure processing are varied. Moreover, selectivity in photo-resist materials is limited, and the use of the transparent substrate makes the method less compatible with the existing Si-based semiconductor industry.

SUMMARY OF THE INVENTION

It is an object of the present invention to provide a method and an apparatus for generating periodic patterns by step-and-align interference lithography, using at least two coherent light beams with controlled intensity distribution to project onto a substrate to form an interference-patterned region on the substrate. The period of the periodic patterns can be adjusted by varying the incident angle of the coherent light beams.

It is another object of the present invention to provide a method and an apparatus for generating periodic patterns by step-and-align interference lithography, by moving the substrate or the light beams stepwisely to form a patterned region with a large area on the substrate. Thereby, environment can be precisely controlled during exposure to prevent disturbance such as temperature gradient, airflow, humidity and mechanical vibration.

It is still another object of the present invention to provide a method and an apparatus for generating periodic patterns by step-and-align interference lithography, using one or multiple beam shapers to convert the non-uniform intensity profiles such as of Gaussian distribution into light beams with uniform intensity profiles so that a large-area interference patterned region can be formed by stepwisely scanning small-size interference patterns formed on the substrate.

It is still another object of the present invention to provide a method and an apparatus for generating periodic patterns by step-and-align interference lithography, using four coherent light beams to form two-dimensional periodic patterns on a cylindrical substrate.

In one embodiment, the present invention provides a method for generating periodic patterns by step-and-align interference lithography, comprising steps of: (a) providing at least two coherent light beams with a pattern and a substrate to be exposed; (b) exposing the substrate to the coherent light beams simultaneously to form a patterned region on the substrate; (c) adjusting a next exposing position stepwise; and (d) repeating step (b) to step (c) until a large area of the patterned region is formed on the substrate.

In another embodiment, the present invention provides an apparatus for generating periodic patterns by step-and-align interference lithography, comprising: a light generating unit, capable of generating at least two coherent light beams with a pattern; a carrier unit, capable of carrying a substrate to be exposed to the coherent light beams simultaneously to form a patterned region; and a driver unit, coupled to the carrier unit to provide a driving force to move the carrier unit stepwisely.

BRIEF DESCRIPTION OF THE DRAWINGS

The objects, spirits and advantages of the preferred embodiment of the present invention will be readily understood by the accompanying drawings and detailed descriptions, wherein:

FIG. 6A to FIG. 6D are examples of patterned regions on a substrate according to the present invention;

DETAILED DESCRIPTION OF THE PREFERRED EMBODIMENT

The present invention can be exemplified by the preferred embodiment as described hereinafter.

Figure 1:
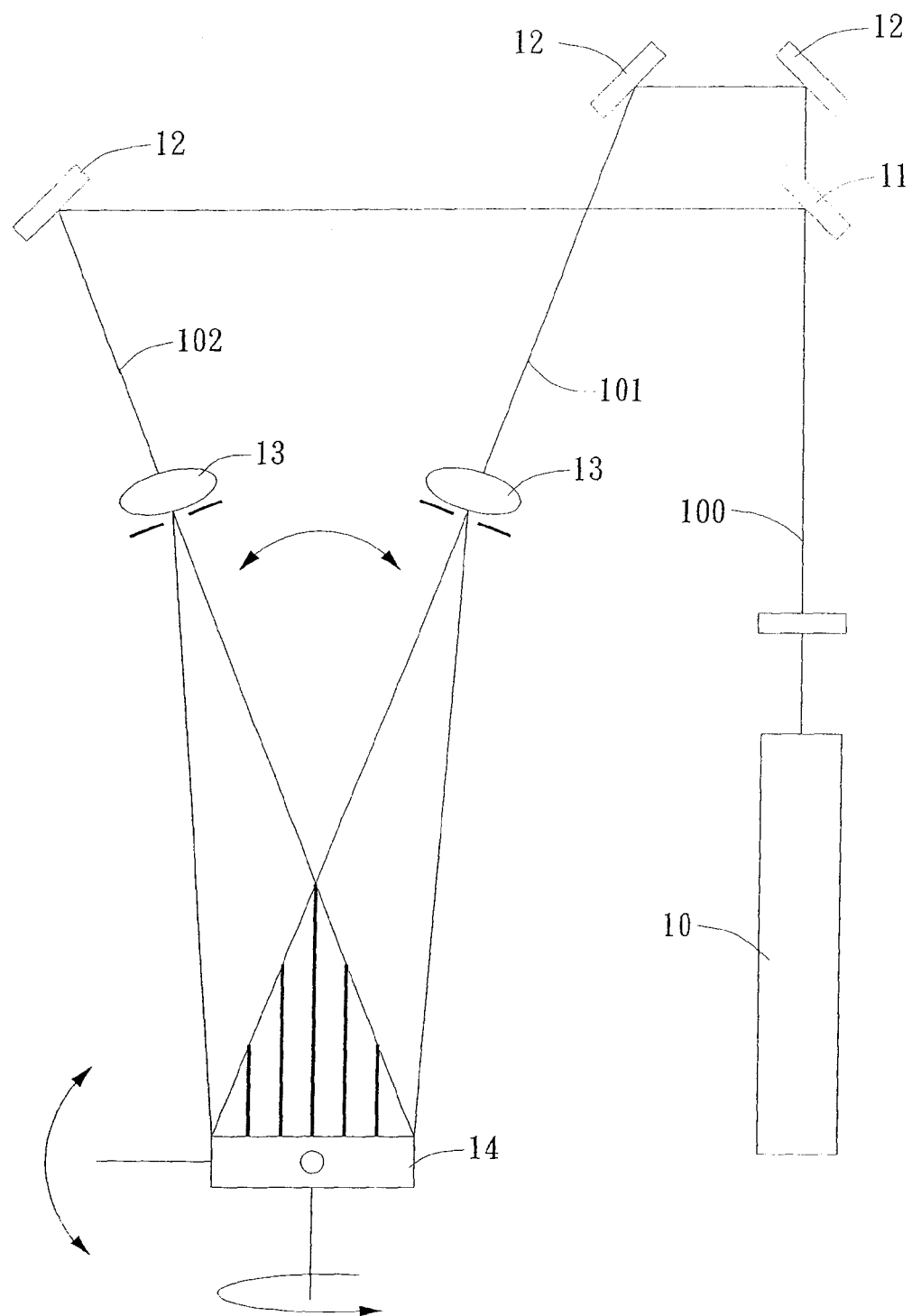
FIG. 1 is a schematic diagram showing a conventional interference lithography apparatus in the prior art.
Figure 2:
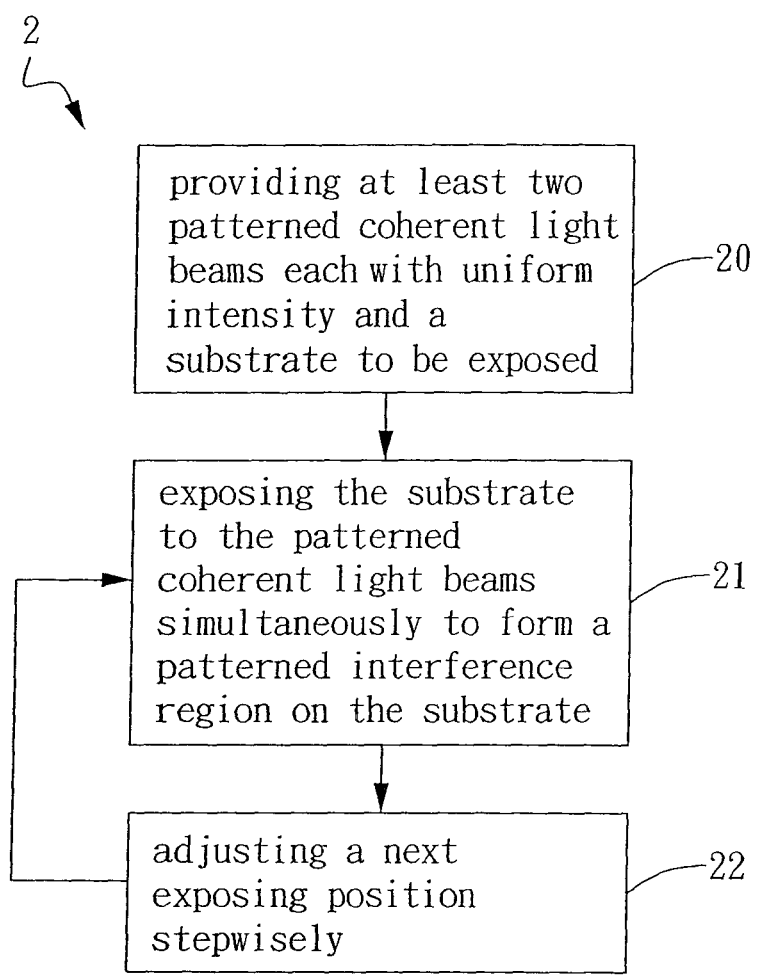
FIG. 2 is a flow-chart showing a method for generating periodic patterns by step-and-align interference lithography according to one embodiment of the present invention.
Figure 3A:
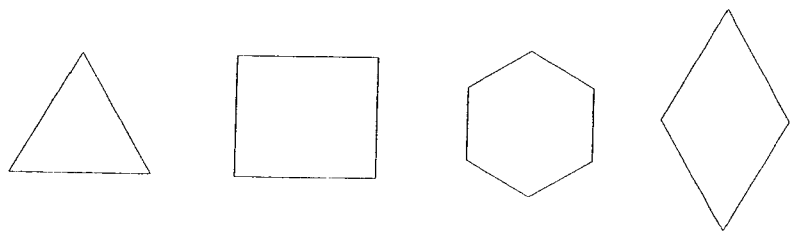
FIG. 3A and FIG. 3B are examples of patterns according to the present invention.
Figure 3B:
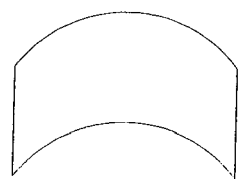
Figure 4A:
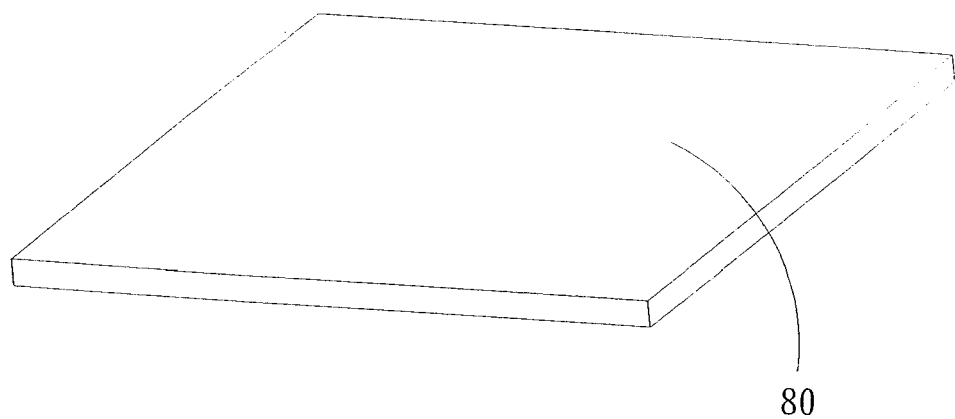
FIG. 4A and FIG. 4B are examples of substrates to be exposed according to the present invention.
Figure 4B:
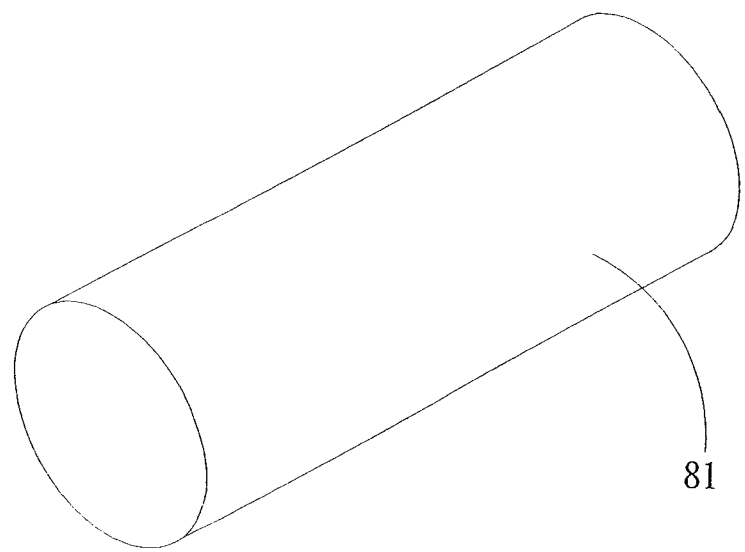

Please refer to FIG. 2, which is a flow-chart showing a method for generating periodic patterns by step-and-align interference lithography according to one embodiment of the present invention. The method 2 comprises steps described hereinafter. First, in Step 20, at least two coherent light beams with a pattern and a substrate to be exposed are provided. Referring to FIG. 3A, the pattern described in Step 20 can be polygonal. For example, the pattern is exemplified by but not limited to a triangle, a quadrangle and a hexagon. As shown in FIG. 3B, the pattern described in Step 20 can also be arc-sided. Please refer to FIG. 4A and FIG. 4B, showing examples of substrates to be exposed according to the present invention. In FIG. 4A, the substrate 80 to be exposed is planar; and in FIG. 4B, the substrate 81 to be exposed is arc-surfaced. For example, the arc-surfaced substrate 81 is a cylindrical substrate. In the present invention, the substrate to be exposed is one of a semiconductor substrate, a glass substrate, a plastic substrate, a metal substrate, a flexible substrate and a rubber substrate.

Afterwards, in Step 21, the substrate is exposed to the coherent light beams simultaneously so as to form a patterned interference region on the substrate. In Step 22, a next exposing position is adjusted stepwisely. The exposing position is adjusted by varying the position of the substrate stepwisely or by adjusting the incident position of the coherent light beams stepwisely. Then, returning to Step 21 again, the substrate is exposed to the coherent light beams simultaneously to form another patterned region, which is adjacent to the previously formed patterned region. By repeating Step 21 to Step 22, a large-area interference patterned region is thus formed on the substrate.

Figure 5A:
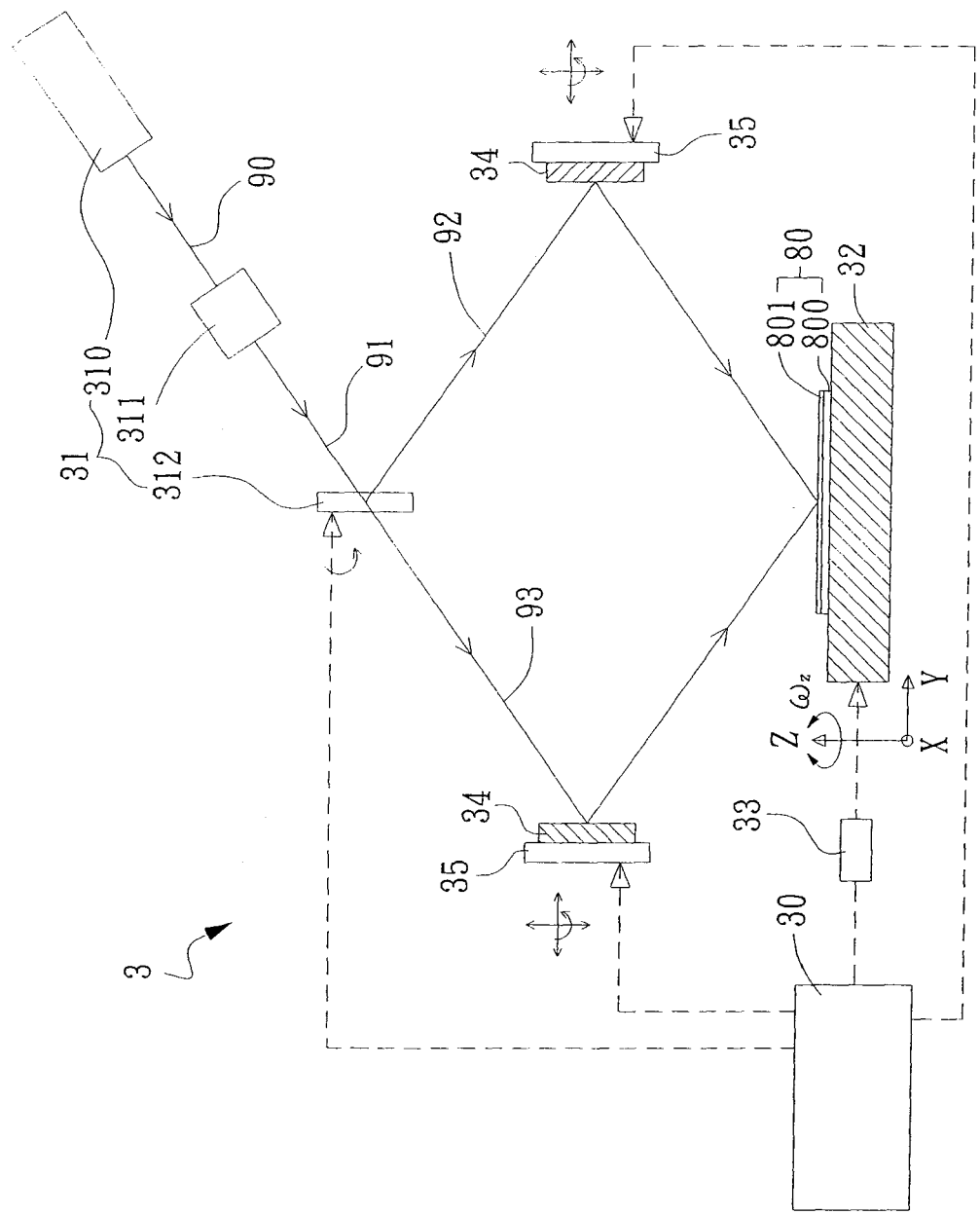
FIG. 5A is a schematic diagram showing an apparatus for generating periodic patterns by step-and-align interference lithography according to a first embodiment of the present invention.

Please refer to FIG. 5A, which is a schematic diagram showing an apparatus for generating periodic patterns by step-and-align interference lithography according to a first embodiment of the present invention. The apparatus 3 comprises a light generating unit 31, a carrier unit 32, and a driver unit 33. The light generating unit 31 is capable of generating at least two coherent light beams with a pattern. The light generating unit 31 further comprises: a beam generator 310, a beam shaper 311 and a beam splitter 312. The beam generator 310 is capable of generating at least a light beam 90. In the present embodiment, the beam generator 310 is a laser generator. The beam shaper 311 is capable of receiving and shaping the light beam 90 to form a shaped light beam 91. The light beam 90 generated from the beam generator 310 has a Gaussian distribution profile and the intensity of the light beam 90 is non-uniform. Therefore, the beam shaper 311 is used to convert the light beam 90 to a shaped light beam 91 with uniform intensity. The shape of the shaped light beam is exemplified by the examples as shown in FIG. 3A and FIG. 3B. The beam splitter 312 is capable of splitting the shaped light beam into the at least two coherent light beams 92 and 93.

The carrier unit 32 is disposed on one side of the light generating unit 31 and is capable of carrying a substrate 80 to be exposed. In the present embodiment, the carrier unit 32 is a movable platform. The substrate 80 comprises a plate 800 with a coating 801 thereon to be exposed. The driver unit 33 is coupled to the carrier unit 32 to provide a driving force to move the carrier unit 32 stepwisely. In the present embodiment, the driver unit 33 is exemplified by but not limited to a stepping motor capable of driving the carrier unit 32 to move in three dimensions. A plurality of reflectors 34 are disposed between the beam splitter 312 and the substrate 80. The reflectors 34 are disposed at adjustment positions 35 where the rotating angle and the position are adjustable. By adjusting each of the adjustment positions 35, the incident angle of the coherent light beams 92 and 93 onto the substrate 80 is adjustable to further adjust the period of the periodic patterns.

The light generating unit 31, the carrier unit 32, the driver unit 33 and the adjustment positions 35 are coupled respectively to a control unit 30 to respond to a signal generated by the control unit 30. More particularly, the operation of the apparatus for generating periodic patterns by step-and-align interference lithography is described hereinafter. The control unit 30 uses the signal to control the light generating unit 31 to generate two coherent light beams 92 and 93, and issues the signal to control the driving unit 33 to adjust the position of the carrier unit 32, and controls the adjustment position 35 to adjust the position of the reflectors. Then, the coating 801 on the substrate 80 is exposed to the two coherent light beams 92 and 93 simultaneously so as to form an interference patterned region on the coating 801.

Figure 5B:
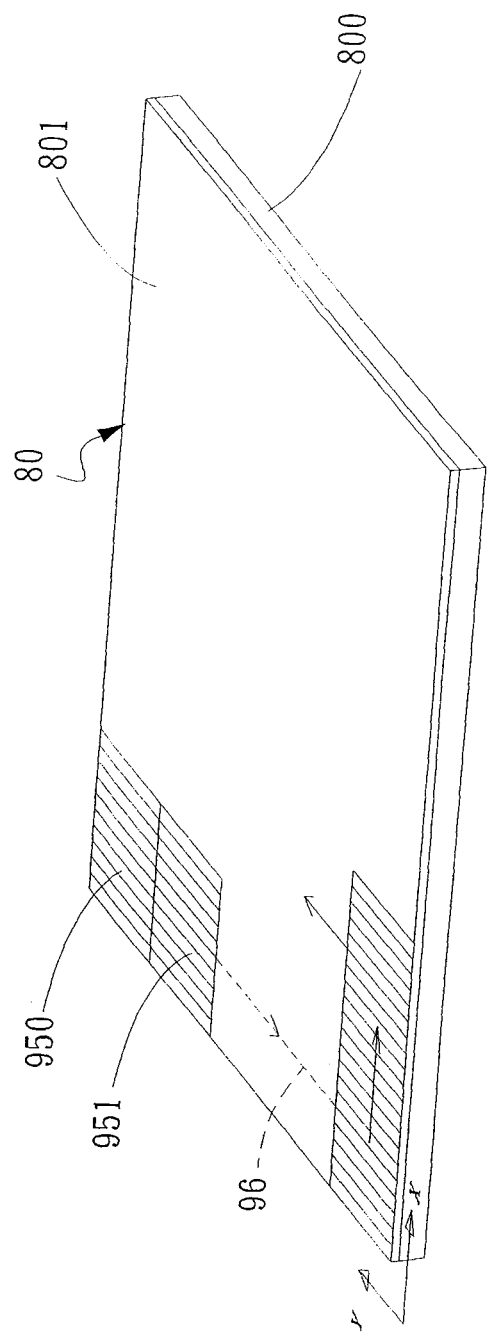
FIG. 5B is a schematic diagram showing a substrate after multi-step exposure.

Afterwards, the control unit 30 controls the driving unit 33 to stepwisely adjust the carrier unit 32 to a next exposure position. When the carrier unit 32 is moved to the next exposure position, the substrate 80 is exposed to the two coherent light beams 92 and 93 to form interference patterns as shown in FIG. 5B. The interference-patterned region 950 is formed after a first-step exposure. The interference-patterned region 951 is formed after a second-step exposure. The number 96 indicates the stepping path. In order to control the precision of the interference patterns, the position of the substrate to be exposed is controlled to move stepwisely so that the current interference-patterned region is partially overlapped with the previous interference-patterned region to form a large-area periodic patterned region.

Figure 5C:
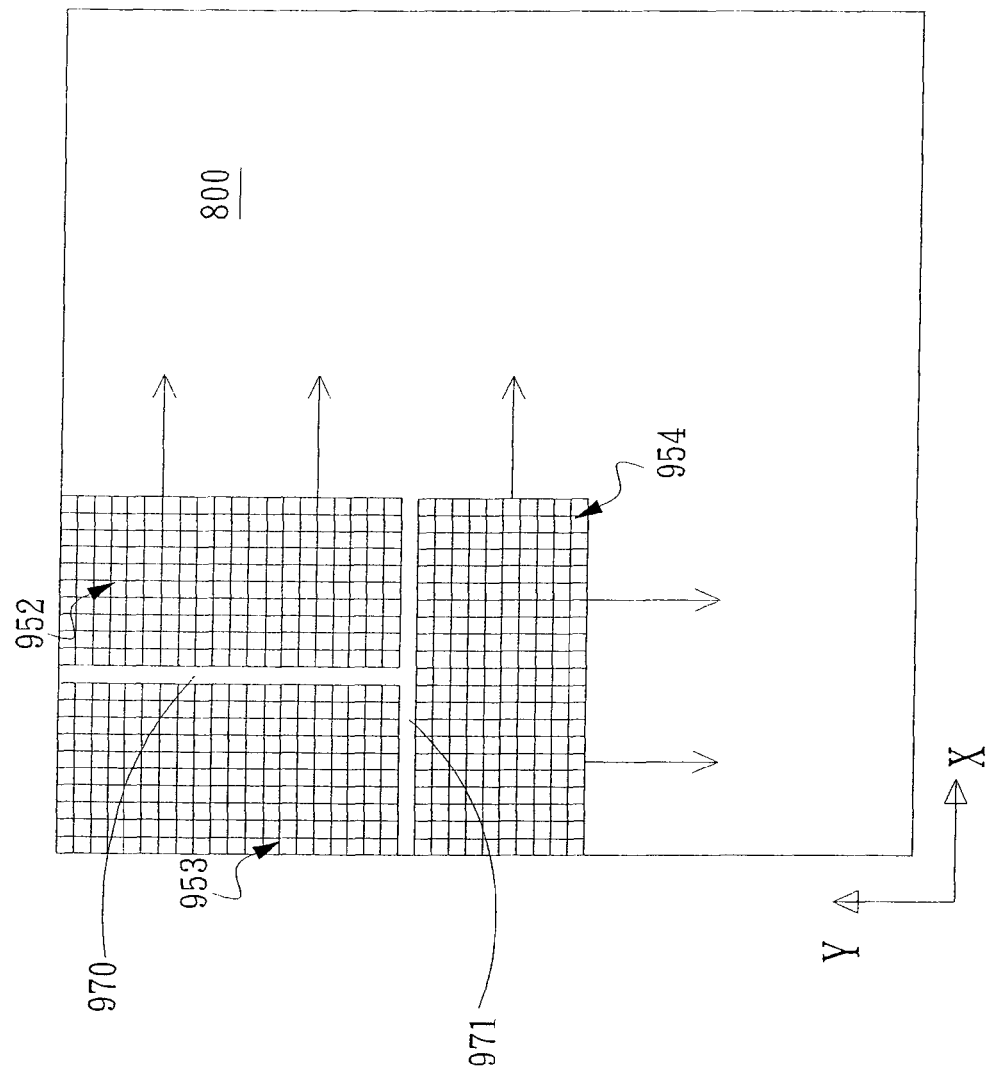
FIG. 5C is a schematic diagram showing exposed regions on a substrate according to another embodiment of the present invention.
Figure 6B:
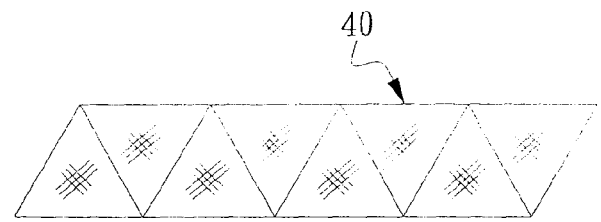
Figure 6B:
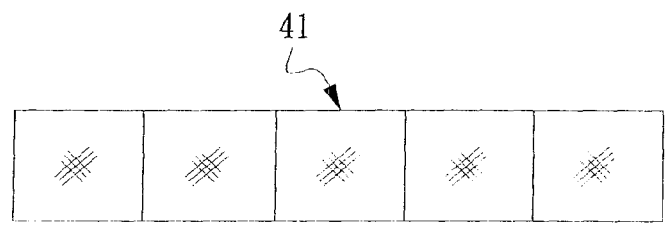
Figure 6C:
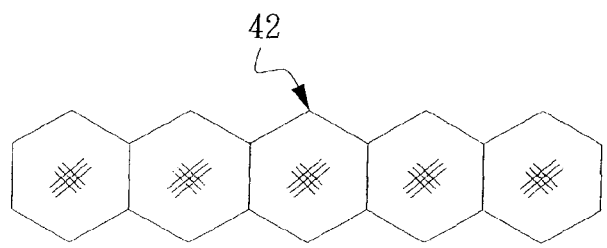
Figure 6D:
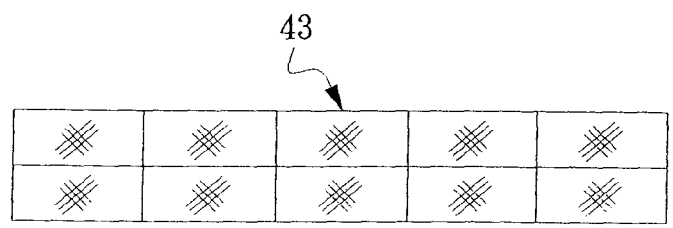

Please refer to FIG. 5C, which is a schematic diagram showing exposed regions on a substrate according to another embodiment of the present invention. In the present embodiment, a spacing region is formed between adjacent patterned regions. In FIG. 5C, a spacing region 970 is formed between adjacent patterned regions 952 and 953 on the plate 800, and a spacing region 971 is formed between adjacent patterned regions 952, 953 and 954. In the present embodiment, the interference-patterned region is a two-dimensional structure. Such a large-area periodic patterned structure with a spacing region can be used in various manufacturing processes and products, for example, photonic crystal waveguides, conductive wires, biological micro/nano paths, etc. Taking a photonic crystal waveguide for example, the spacing regions 970 and 971 can be waveguide regions and the patterned regions 952, 953 and 954 can be photonic crystal regions.

FIG. 6A to FIG. 6D are examples of patterned regions on a substrate according to the present invention. Large-area patterned regions 40, 41, 42, and 43 can be formed by multi-step exposure to stitch adjacent interference-patterned regions formed by coherent light beams with different patterns. Since the area of the patterned region is determined by the overlapped regions of the light beams 92 and 93 in FIG. 5A, sub-micron scale periodic patterned regions having an area of several square centimeters or larger can be formed after a first-step exposure. Then, the periodic patterned regions can be stitched after stepwise exposure. Therefore, a large-area periodic patterned region can be formed by using multi-step exposure.

Figure 7A:
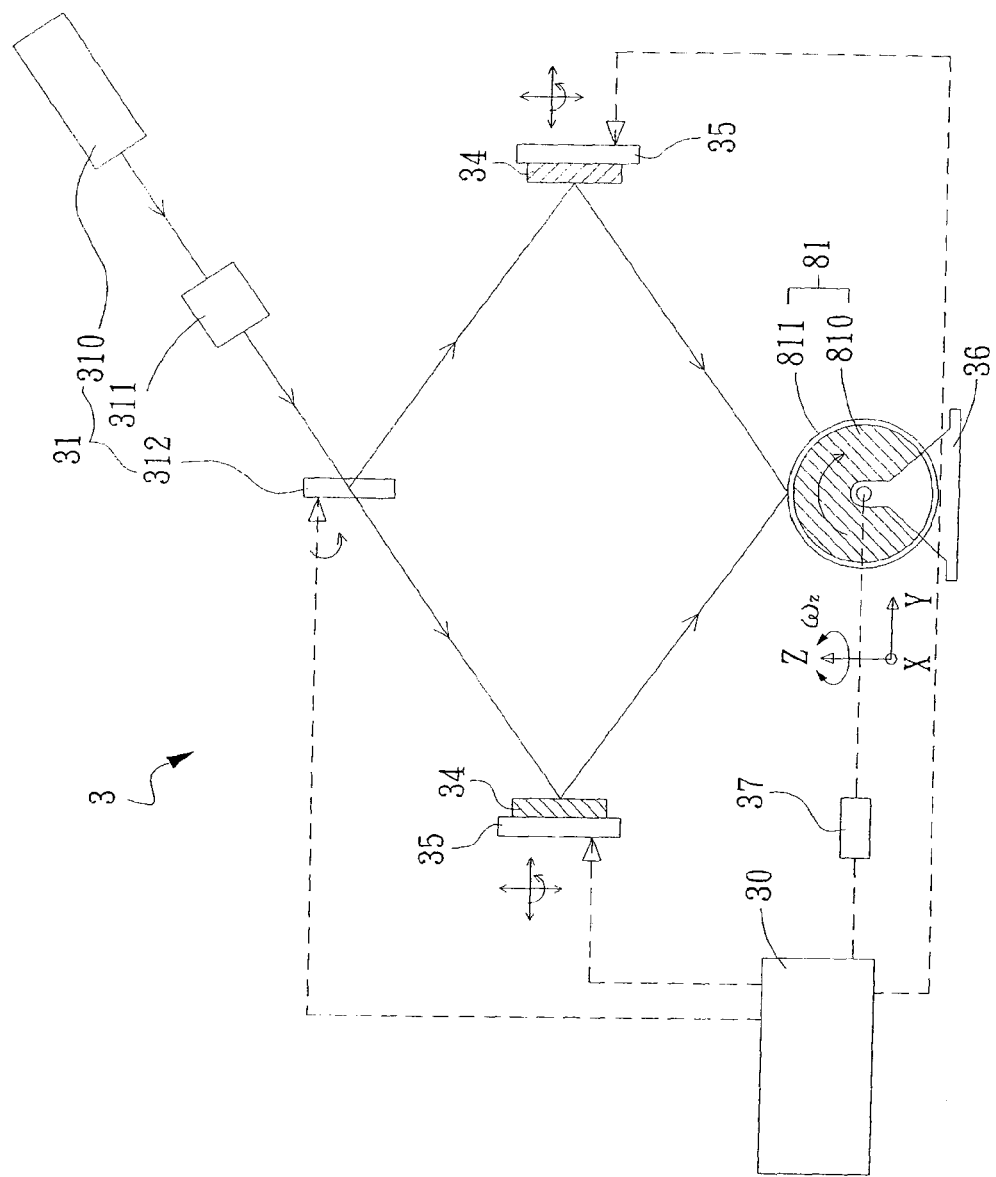
FIG. 7A is a schematic diagram showing an apparatus for generating periodic patterns by step-and-align interference lithography according to a second embodiment of the present invention.
Figure 7B:
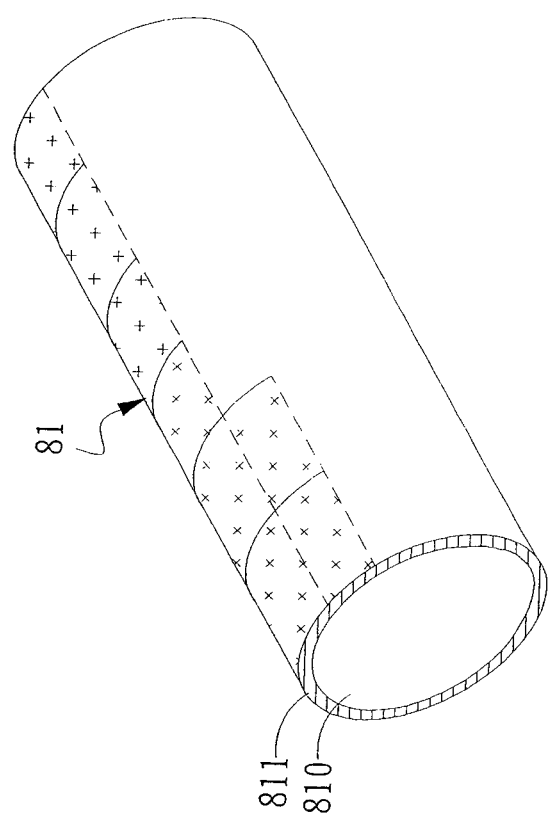
FIG. 7B is a schematic diagram showing a cylindrical substrate for multi-step exposure by employing step-and-align interference lithography.

Please refer to FIG. 7A, which is a schematic diagram showing an apparatus for generating periodic patterns by step-and-align interference lithography according to a second embodiment of the present invention. The elements in FIG. 7A are identical to those in FIG. 5A except that the substrate 81 to be exposed carried by the carrier unit 36 is a cylindrical substrate comprising a cylindrical plate 810 with a coating 811 thereon to be exposed. Moreover, the motor unit 37 is exemplified by but not limited to a stepping motor capable of driving the substrate 81 to rotate and driving the carrier unit 36 to move in three dimensions. By controlling the exposure position stepwisely, a large-area interference patterns can be formed on the substrate 81, as shown in FIG. 7B.

Figure 8:
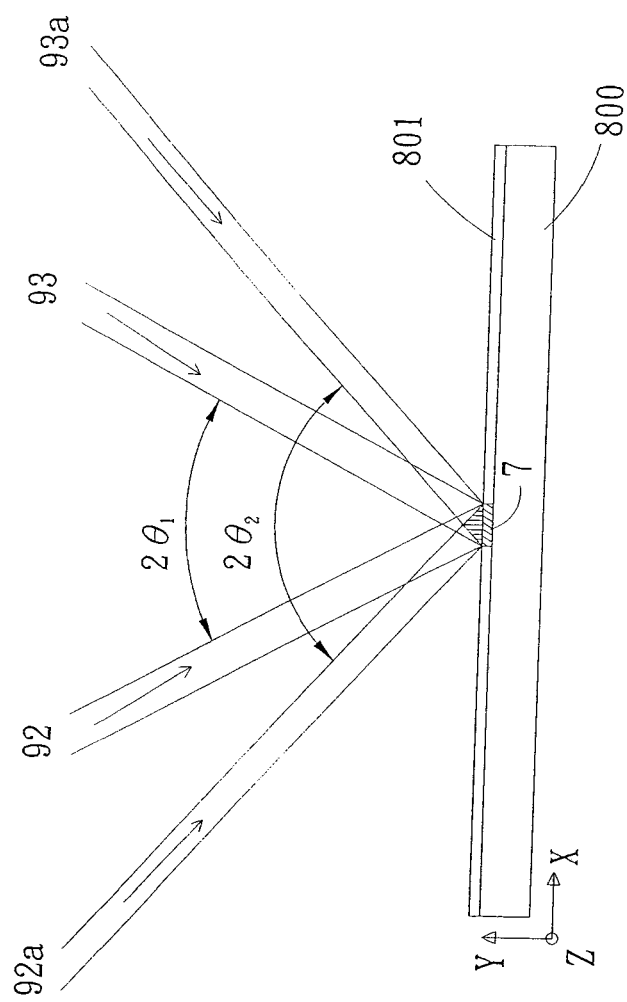
FIG. 8 is a schematic diagram showing four coherent light beams incident on a substrate to form a patterned region with a large area.
Figure 9B:
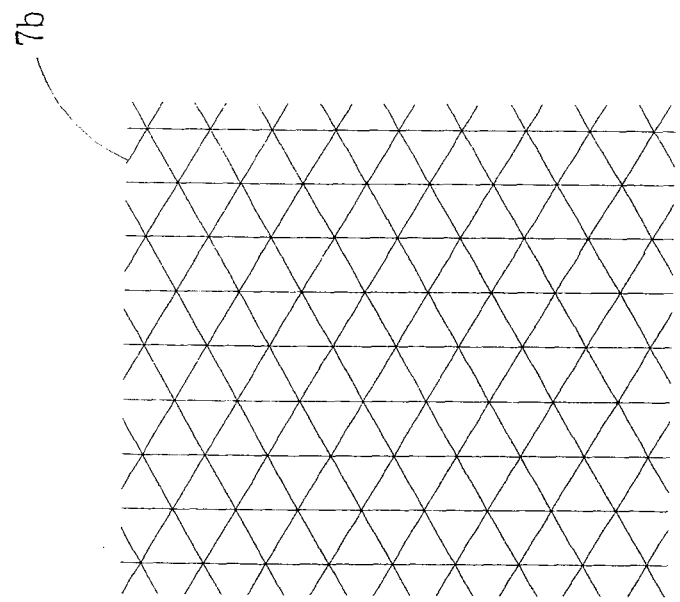
FIG. 9A and FIG. 9B are examples of large-area two-dimensional periodic patterns formed by four coherent light beams.
Figure 9A:
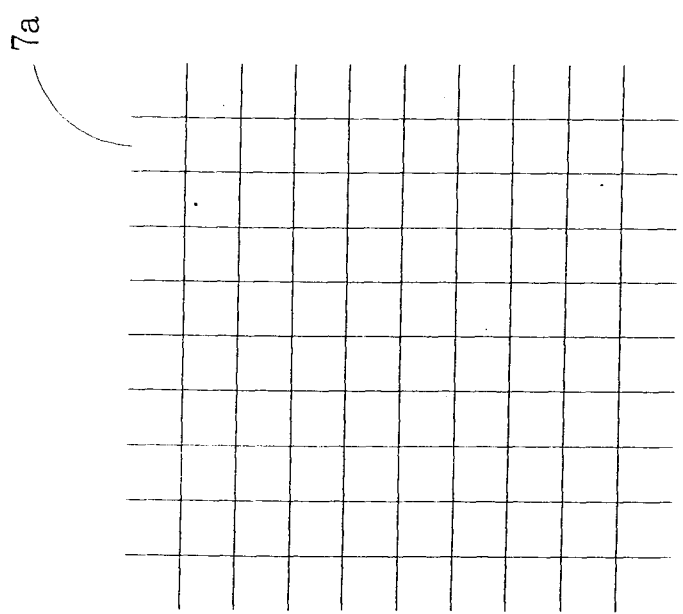

Please refer to FIG. 8, which is a schematic diagram showing a plurality of pairs of coherent light beams incident on a substrate to form large-area periodic patterns. In the present embodiment, the apparatus in FIG. 5A or 7A can be used for implementation. However, the apparatus in FIG. 5A or 7A comprises a plurality of light generating units so as to generate at least four coherent light beams 92, 93, 92a, and 93a for interference lithography to form large-area two-dimensional patterns 7a and 7b (as shown in FIG. 9A and FIG. 9B). For example, the two-dimensional patterns are periodic micro-scale structures such as lines, holes, rods and the like. The angle $\theta_1$ between the coherent light beams 92 and 93 and the angle $\theta_2$ between the coherent light beams 92a and 93a can be adjusted to be equal or not according to the adjustment position 35 in FIG. 5A or FIG. 7A.

In addition to forming two-dimensional periodic patterns by using at least four coherent light beams in FIG. 8, two-dimensional periodic patterns can also be formed by using the carrier unit 32 or 36 in FIG. 5A or 7A.

Figure 10:
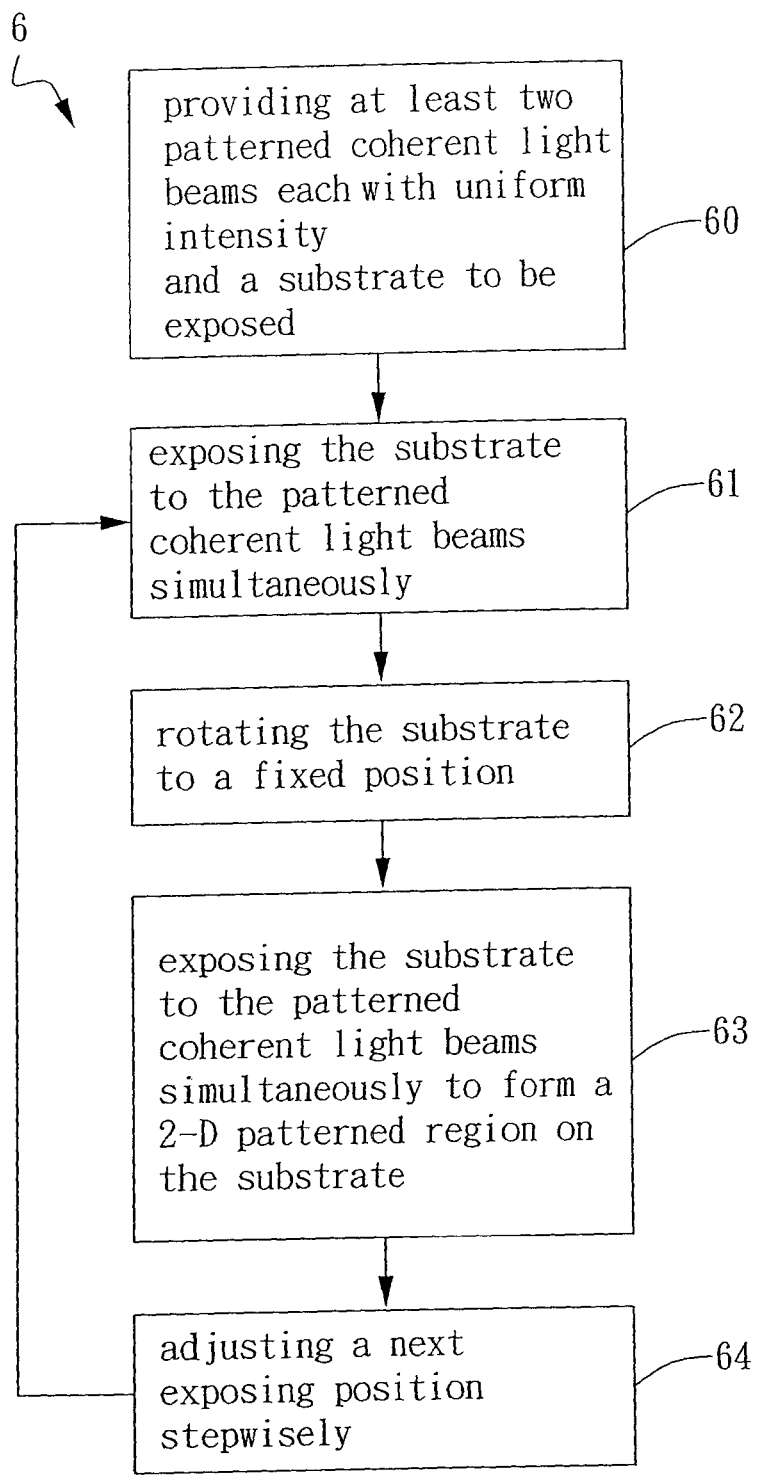
FIG. 10 is a flow-chart showing a method for generating periodic patterns by step-and-align interference lithography according to another embodiment of the present invention.

Please refer to FIG. 10, which is a flow-chart showing a method for generating periodic patterns by step-and-align interference lithography according to another embodiment of the present invention. The method can be implemented by using FIG. 5A. The method 6 comprises described hereinafter. Firstly, in Step 60, at least two coherent light beams with a pattern and a substrate to be exposed are provided. The pattern and the substrate are identical to those described in the previously embodiments and thus described thereof is omitted.

Afterwards, in Step 61, the substrate is exposed to at least two coherent light beams simultaneously to form a patterned region on the substrate. In Step 62, the carrier unit 32 rotates to drive the substrate 80 to a fixed angle. In the present embodiment, the angle is exemplified by but not limited to 90°. In Step 63, the substrate is exposed to the two coherent light beams simultaneously so as to form a two-dimensional patterned region on the substrate. In Step 64, the carrier unit is controlled to move stepwisely so as to adjust the substrate to a next exposure position. By repeating Step 61 to Step 64, a large-area two-dimensional periodic interference patterned region is thus formed on the substrate.

According to the above discussion, it is apparent that the present invention discloses a method and an apparatus for generating periodic patterns by step-and-align interference lithography to form large-area periodic patterns. The features and advantages are summarized hereinafter:

1. efficiency: hundreds or thousands of interference fringes formed simultaneously in an interference region, which is unlike one-by-one formation by the conventional e-beam direct write or diamond cut;
2. reliability: fast exposure to prevent disturbance and unstable conditions such as temperature gradient, airflow, humidity and mechanical vibration;
3. seamless stitching of small-area patterns: using a beam shaper to convert the Gaussian light beam with non-uniform intensity profile into a light beam with uniform intensity;

4. availability for large-area periodic sub-micro scale structures: by using small-area interference patterned regions as steps to move the carrier unit stepwisely for multi-step exposure to stitch small-area interference patterned regions;
5. manufacturing flexibility: capability in forming two-dimensional patterns and periodic patterns on a cylindrical substrate.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for generating periodic patterns by step-and-align interference lithography, comprising steps of:
   (a) providing at least two coherent light beams with a pattern and a substrate to be exposed;
   (b) exposing the substrate to the at least two coherent light beams simultaneously so as to form a patterned interference region on the substrate at one of plural exposure shot areas;
   (c) adjusting a next exposing position stepwisely; and
   (d) repeating step (b) to step (c) so that another patterned interference region is formed by alternating motions of one stepwise movement of the carrier unit and one shot of exposure of the at least two coherent light beams simultaneously incident on the substrate, wherein the substrate is prevented from being exposed to the at least two coherent light beams when the substrate is moving, until a plural patterned interference regions are formed on the substrate,
   wherein the patterned interference regions are configured so that the exposure patterns of the patterned interference regions are identical to each other, and
   wherein a right boundary of each patterned interference region is identical to a left boundary of a corresponding neighboring patterned interference region, or an upper boundary of each patterned interference region is identical to a lower boundary of a corresponding neighboring patterned interference region.

2. The method as recited in claim 1, wherein the pattern is polygonal or arc-sided.

3. The method as recited in claim 1, wherein the substrate is planar or arc-surfaced.

4. The method as recited in claim 1, wherein an incident angle of the at least two coherent light beams onto the substrate is adjustable.

5. The method as recited in claim 1, wherein step (c) is performed by adjusting the position of the substrate stepwisely.

6. The method as recited in claim 1, wherein step (c) is performed by adjusting the incident position of the at least two coherent light beams stepwisely.

7. The method as recited in claim 1, wherein step (b) further comprises steps of:
   (b1) exposing the substrate to the at least two coherent light beams simultaneously;
   (b2) moving and rotating the substrate to a fixed position; and
   (b3) exposing the substrate to the at least two coherent light beams simultaneously so as to form a two-dimensional patterned interference region on the substrate.

8. The method as recited in claim 1, wherein the at least two coherent light beams have a uniform light intensity.

9. The method as recited in claim 1, wherein the substrate is one of a semiconductor substrate, a glass substrate, a plastic substrate, a metal substrate, a flexible substrate and a rubber substrate.

10. The method as recited in claim 1, wherein a spacing region is formed between adjacent patterned interference regions.

* * * * *